United States Patent
Sharma

(10) Patent No.: US 11,502,078 B2
(45) Date of Patent: Nov. 15, 2022

(54) LATCH-UP IMMUNIZATION TECHNIQUES FOR INTEGRATED CIRCUITS

(71) Applicant: STMicroelectronics International N.V., Schiphol (NL)

(72) Inventor: Vishal Kumar Sharma, Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 129 days.

(21) Appl. No.: 17/152,272

(22) Filed: Jan. 19, 2021

(65) Prior Publication Data

US 2021/0143151 A1    May 13, 2021

Related U.S. Application Data

(62) Division of application No. 16/450,141, filed on Jun. 24, 2019, now Pat. No. 10,930,650.

(60) Provisional application No. 62/691,024, filed on Jun. 28, 2018.

(51) Int. Cl.
| | |
|---|---|
| H01L 27/092 | (2006.01) |
| H01L 27/02 | (2006.01) |
| H01L 27/11 | (2006.01) |
| H01L 29/06 | (2006.01) |
| H01L 29/78 | (2006.01) |
| H01L 29/74 | (2006.01) |
| H01L 27/118 | (2006.01) |

(52) U.S. Cl.
CPC ...... *H01L 27/0921* (2013.01); *H01L 27/0925* (2013.01); *H01L 29/0619* (2013.01); *H01L 29/0649* (2013.01); *H01L 27/0274* (2013.01); *H01L 27/0277* (2013.01); *H01L 2027/1189* (2013.01)

(58) Field of Classification Search
CPC ............. H01L 27/0921; H01L 27/0925; H01L 27/0274; H01L 27/0277; H01L 27/11807; H01L 27/0262; H01L 2027/1189; H01L 29/0619; H01L 29/0649; H01L 29/78; H01L 29/74; H01L 29/0603; H01L 29/0684

See application file for complete search history.

(56) References Cited

U.S. PATENT DOCUMENTS

| | | | |
|---|---|---|---|
| 5,576,557 A | 11/1996 | Ker et al. | |
| 5,796,147 A * | 8/1998 | Ono | H01L 27/0218 257/369 |
| 6,307,233 B1 | 10/2001 | Awaka et al. | |
| 6,765,771 B2 | 7/2004 | Ker et al. | |
| 7,937,639 B2 | 5/2011 | Sonnekalb | |
| 8,169,760 B2 | 5/2012 | Change et al. | |
| 8,587,071 B2 | 11/2013 | Tsai et al. | |
| 8,803,276 B2 | 8/2014 | Chang et al. | |
| 8,823,129 B2 | 9/2014 | Lai et al. | |

(Continued)

OTHER PUBLICATIONS

Texas Instruments, White Paper, SCAA124, Apr. 2015, 10 pages.

*Primary Examiner* — Ida M Soward
(74) *Attorney, Agent, or Firm* — Crowe & Dunlevy

(57) ABSTRACT

In an integrated circuit supporting complementary metal oxide semiconductor (CMOS) integrated circuits, latch-up immunity is supported by surrounding a hot n-well with an n-well strap spaced from the hot n-well by a specified distance in accordance with design rules. The n-well strap is positioned between the hot n-well and other n-well or n-type diffusion structures.

42 Claims, 7 Drawing Sheets

(56) References Cited

U.S. PATENT DOCUMENTS

| | | |
|---|---|---|
| 9,202,760 B2 | 12/2015 | Domanski |
| 9,673,187 B2 | 6/2017 | Salcedo et al. |
| 10,008,490 B2 | 6/2018 | Salcedo et al. |
| 10,141,299 B2 | 11/2018 | Toyoda et al. |
| 10,319,714 B2 | 6/2019 | Luo et al. |
| 10,573,638 B2 | 2/2020 | Lin et al. |
| 2008/0067601 A1* | 3/2008 | Chen .................. H01L 27/0259 257/361 |
| 2008/0122517 A1* | 5/2008 | Pichler ................. H01L 27/082 257/E29.187 |
| 2011/0121394 A1 | 5/2011 | Su et al. |
| 2012/0074539 A1* | 3/2012 | Yu ...................... H01L 27/0255 257/659 |
| 2012/0099230 A1* | 4/2012 | Moon ................. H01L 29/8611 361/56 |
| 2012/0161232 A1 | 6/2012 | Farbiz et al. |
| 2016/0111411 A1* | 4/2016 | Kalnitsky ........... H01L 27/0259 438/353 |
| 2016/0141358 A1* | 5/2016 | Salcedo ............. H01L 27/0259 257/168 |
| 2019/0051646 A1 | 2/2019 | Salcedo et al. |

\* cited by examiner

LATCH-UP IMMUNIZATION TECHNIQUES FOR INTEGRATED CIRCUITS

CROSS-REFERENCE TO RELATED APPLICATION

This application is a divisional of U.S. Application for patent Ser. No. 16/450,141, filed Jun. 24, 2019, which claims the priority benefit of U.S. Provisional Application for Patent No. 62/691,024 filed Jun. 28, 2018, the disclosures of which are incorporated herein by reference.

TECHNICAL FIELD

The present invention relates generally to integrated circuits and, in particular, to integrated circuit designs providing improved immunity against latch-up.

BACKGROUND

Latch-up is an operating condition within an integrated circuit where a low impedance path is formed between a power supply node and a ground node, and a large current may flow through this low impedance path causing damage to the integrated circuit. A trigger event (such as a current injection or an over-voltage condition) causes the low impedance path to form. Once formed, feedback causes the low impedance path to remain in place notwithstanding dissipation of the triggering event itself. A cycling of the power supply is typically required to eliminate the low impedance path.

Integrated circuits of the complementary metal oxide semiconductor (CMOS) type use n-channel transistors (nMOS) and p-channel transistors (pMOS) to form circuit functions. It is the proximity of the PN junctions of those nMOS and pMOS transistors that create inherent parasitic transistors and diodes. These parasitic circuit structures can form PNPN thyristors (i.e., silicon controlled rectifiers—SCRs) triggered by a current or voltage impulse applied to any of an input node, an output node or a supply node. The trigger event, such as with an overshoot or undershoot outside of normal operating voltage and/or current levels, turns on the thyristor and permits current flow through the low impedance path between the power supply and ground nodes.

FIG. 1 shows a cross-section of a CMOS inverter circuit 10. A semiconductor well 12 (for example, doped with n-type dopant) is formed within a semiconductor substrate 14 (for example, doped with p-type dopant). The pMOS transistor 20 of the CMOS inverter circuit 10 is formed in and on the well 12, and includes source and drain regions 22 and 24, respectively, doped with p-type dopant and an insulated gate electrode 26 positioned over a channel region between the source region 22 and drain region 24. The nMOS transistor 30 of the CMOS inverter circuit 10 is formed in and on the substrate 14, and includes source and drain regions 32 and 34, respectively, doped with n-type dopant and an insulated gate electrode 36 positioned over a channel region between the source region 32 and drain region 34. The source region 22 is connected to the power supply node 40 and the source region 32 is connected to the ground node 42. The gate electrodes 26 and 36 are electrically connected together to form an input node 44 of the CMOS inverter circuit 10. The drain regions 24 and 34 are electrically connected together to form an output node 46 of the CMOS inverter circuit 10.

The pMOS transistor 20 forms a parasitic vertical PNP bipolar transistor 50 having an emitter at the p-type doped source and drain regions 22 and 24, a base at the n-type doped well 12 and a collector at the p-type doped substrate 14. The nMOS transistor 30 forms a parasitic lateral NPN bipolar transistor 52 having an emitter at the n-type doped source and drain regions 32 and 34, a base at the p-type doped substrate 14 and a collector at the n-type doped well 12. An equivalent circuit schematic of these parasitic structures is shown in FIG. 2, which also shows the resistance Rwell provided by the n-type doped well 12 between the supply node 40 and the base of the PNP 50, and resistance Rsub provided by the p-type doped substrate 14 between the ground node 42 and the base of the NPN 52.

The latch-up phenomenon, for example, may be triggered by current impulse at the drain 24 of the pMOS transistor 20 which causes the PN junction between drain 24 and well 12 to become forward biased. If this current impulse is high enough (for example, sustained for a sufficient length of time), the carriers injected into the substrate 14 cause a voltage drop across the substrate resistance Rsub. The bias across the PN junction between the substrate 14 and drain 34 of the nMOS transistor 30 may then become high enough to turn on the NPN transistor 52. Collector current in NPN transistor 52 then flows into the base of PNP transistor 50 causing PNP transistor 50 to further turn on. At this point, the latch-up becomes self-sustaining due to positive feedback. The only way to release the latch-up is to remove power from the supply node 40.

As the number of nMOS and pMOS devices within an integrated circuit increase, the danger of latch-up increases due the creation of more parasitic bipolar transistors and the associated PNPN thyristors. Immunizing an integrated circuit against latch-up is a critical design goal. Known latch-up immunization techniques include: spacing of circuit elements, addition of guard rings around certain circuit points, use of substrate ties and well taps, and controlling substrate doping.

SUMMARY

In an embodiment, an integrated circuit comprises: a semiconductor substrate doped with a first conductivity type; a first semiconductor well doped with a second conductivity type within the semiconductor substrate (which includes: a first region heavily doped with the second conductivity type, wherein the first region is connected to a supply node; and a second region heavily doped with the first conductivity type, wherein the second region is connected to an integrated circuit pad); a second semiconductor well doped with the second conductivity type within the semiconductor substrate; a third region heavily doped with the second conductivity type within the second semiconductor well, wherein the third region is connected to a ground node; a third semiconductor well doped with the second conductivity type within the semiconductor substrate; and a fourth region heavily doped with the second conductivity type within the third semiconductor well, wherein the fourth region is connected to the integrated circuit pad through a resistor; wherein the third semiconductor well is positioned within the semiconductor substrate between the first semiconductor well and the second semiconductor well.

In an embodiment, an integrated circuit comprises: a semiconductor substrate doped with a first conductivity type; a first semiconductor well doped with a second conductivity type within the semiconductor substrate (which includes: a first region heavily doped with the second conductivity type, wherein the first region is connected to a supply node; and a second region heavily doped with the first conductivity type, wherein the second region is connected to an integrated circuit pad); a second semiconductor well doped with the second conductivity type within the semiconductor substrate; a third region heavily doped with the second conductivity type within the second semiconductor well, wherein the third region is connected to the integrated circuit pad through a resistor; and a fourth region heavily doped with the second conductivity type within semiconductor substrate, wherein the fourth region is connected to a ground node; wherein said second semiconductor well is positioned within the semiconductor substrate between the fourth region and the first semiconductor well.

In an embodiment, an integrated circuit comprises: a semiconductor substrate doped with a first conductivity type; a first semiconductor well doped with a second conductivity type within the semiconductor substrate (which includes: a first region heavily doped with the second conductivity type, wherein the first region is connected to a supply node; and a second region heavily doped with the first conductivity type, wherein the second region is connected to a first integrated circuit pad); a second semiconductor well doped with the second conductivity type within the semiconductor substrate; a third region heavily doped with the second conductivity type within the second semiconductor well, wherein the third region is connected to a second integrated circuit pad; a third semiconductor well doped with the second conductivity type within the semiconductor substrate; and a fourth region heavily doped with the second conductivity type within the third semiconductor well, wherein the fourth region is connected to the first integrated circuit pad through a resistor; wherein the third semiconductor well is positioned within the semiconductor substrate between the first semiconductor well and the second semiconductor well.

In an embodiment, an integrated circuit comprises: a semiconductor substrate doped with a first conductivity type; a first semiconductor well doped with a second conductivity type within the semiconductor substrate (which includes: a first region heavily doped with the second conductivity type, wherein the first region is connected to a supply node; and a second region heavily doped with the first conductivity type, wherein the second region is connected to a first integrated circuit pad); a second semiconductor well doped with the second conductivity type within the semiconductor substrate; a third region heavily doped with second conductivity type within the second semiconductor well, wherein the third region is connected to a second integrated circuit pad; a third semiconductor well doped with the second conductivity type within the semiconductor substrate; and a fourth region heavily doped with second conductivity type within the third semiconductor well, wherein the fourth region is connected to a power supply node; wherein the third semiconductor well is positioned within the semiconductor substrate between the first semiconductor well and the second semiconductor well.

In an embodiment, an integrated circuit comprises: a semiconductor substrate doped with a first conductivity type; a first semiconductor well doped with a second conductivity type within the semiconductor substrate (which includes: a first region heavily doped with the second conductivity type, wherein the first region is connected to a supply node; and a second region heavily doped with the first conductivity type, wherein the second region is connected to an integrated circuit pad); a second semiconductor well doped with the second conductivity type within the semiconductor substrate; a third region heavily doped with the second conductivity type within the second semiconductor well, wherein the third region is connected to a ground node; a third semiconductor well doped with the second conductivity type within the semiconductor substrate; and a fourth region heavily doped with the second conductivity type within the third semiconductor well, wherein the fourth region is connected to a power supply node; wherein the third semiconductor well is positioned within the semiconductor substrate between the first semiconductor well and the second semiconductor well.

BRIEF DESCRIPTION OF THE DRAWINGS

For a better understanding of the embodiments, reference will now be made by way of example only to the accompanying figures in which.

It will be understood that the cross-sectional views are not drawn to scale.

DETAILED DESCRIPTION

Figure 1:
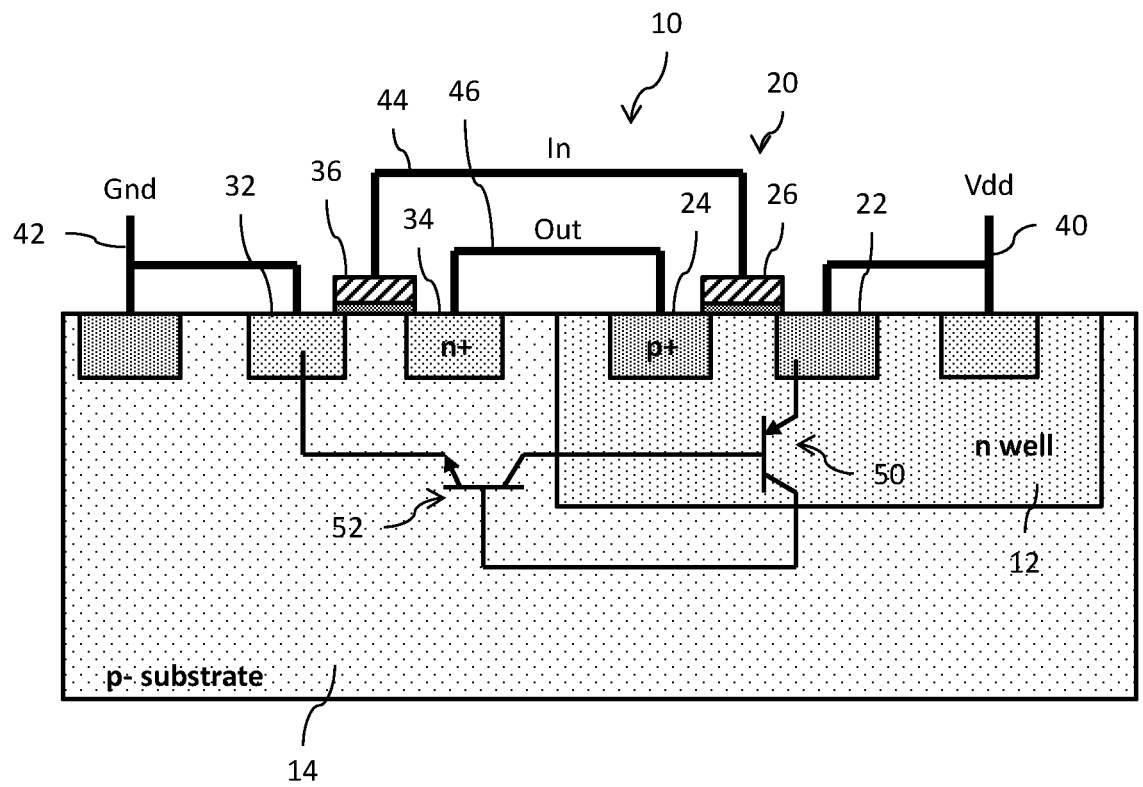
FIG. 1 is a cross-sectional view of an integrated circuit implementation of a CMOS inverter.
Figure 2:
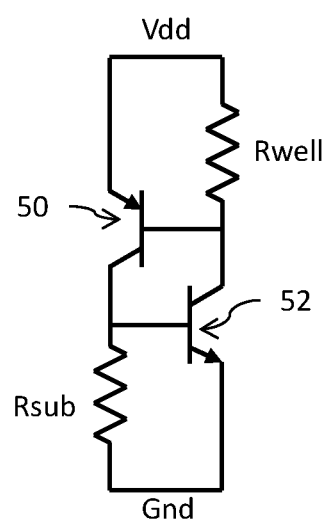
FIG. 2 is an equivalent circuit schematic of FIG. 1 showing parasitic bipolar transistors which form a thyristor.
Figure 3:
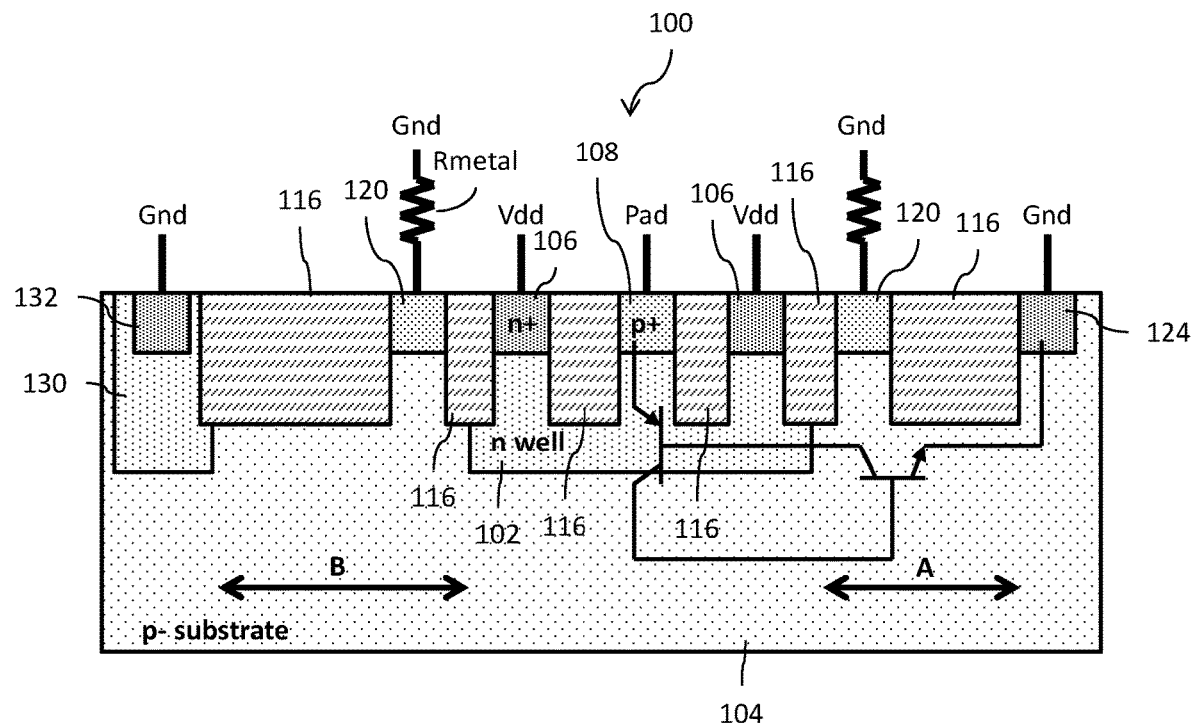
FIG. 3 is a cross-sectional view of an integrated circuit.

Reference is now made to FIG. 3 which shows a cross-section of an integrated circuit 100 which incorporates design techniques and structures for providing latch-up immunity. The integrated circuit 100 includes an n-type doped well 102 within a p-type doped substrate 104. The well 102 is referred to herein as a "hot n-well" which is defined in this instance as an n-type doped well that contains a heavily doped p-type region 108 forming a source/drain region of a pMOS transistor connected directly to an integrated circuit pad (Pad). A hot n-well may also be defined as the bulk of PMOS transistor with drain connected directly to an integrated circuit PAD or a base of PNP transistor with an emitter connected to an integrated circuit pad. The well 102 further includes a heavily doped n-type region 106 that is connected to a power supply node Vdd. The heavily doped n-type region 106 may, for example, form a guard ring structure that surrounds the heavily doped p-type region 108. The heavily doped p-type region 108 may be isolated from the heavily doped n-type region 106 by a shallow trench isolation (STI) structure 116.

The circuit 100 further includes a heavily doped p-type region 120 within the p-type doped substrate 104 to form a connection to the ground node (Gnd) through a resistance Rmetal formed due to inherent resistance of the metallization layers of the integrated circuit. The heavily doped p-type region 120 may, for example, form a guard ring structure that surrounds the well 102. The heavily doped p-type region 120 may be isolated from the heavily doped n-type region 106 by the STI structure 116.

A heavily doped n-type region 124 within the p-type doped substrate 104 is also connected to the ground node Gnd. The heavily doped n-type region 124 may be isolated from the heavily doped p-type region 120 by the STI structure 116.

The circuit 100 further includes an n-type doped well 130 including a heavily doped n-type region 132 to form a connection to the ground node Gnd. The well 130 is referred to herein as a "grounded n-well." The heavily doped n-type region 132 may be isolated from the heavily doped p-type region 120 by the STI structure 116.

To provide for latch-up immunity, the heavily doped n-type region 124 is spaced from the well 102 by a distance A specified by the design rules governing spacing between a heavily doped n-type region in a p-type substrate and a hot n-well. Additionally, the n-type doped well 130 is spaced from the well 102 by a distance B specified by the design rules governing the spacing between any n-well and a hot n-well in a p-type substrate. As an example, for a given voltage from either Pad or Vdd to Gnd that is greater than or equal to a threshold, the distances A and B are each set to ensure a high impedance state of the PNPN thyristor and degrade the gain of the parasitic bipolar transistors.

Latch-up immunity is further enhanced by enclosing the heavily doped p-type region 108 within the n-well 102 by a double guard ring formed by the heavily doped n-type region 106 within the well 102 and the heavily doped p-type region 120 within the p-type doped substrate 104.

Figure 4:
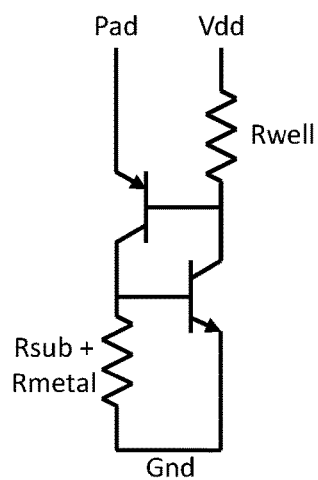
FIG. 4 is an equivalent circuit schematic of FIG. 3 showing parasitic bipolar transistors which form a thyristor immunized against latch-up.

The equivalent circuit schematic of the parasitic structures presented by the integrated circuit 100 is shown in FIG. 4.

The spacing requirements for distances A and B have an adverse effect on the occupied area of the integrated circuit 100. In order to provide the necessary latch-up immunity, the area occupied by these integrated circuits must be made larger in order to support the minimum spacing requirements and guard ring structure necessitated by the design rules. There would be an advantage if latch-up immunity for a circuit configuration like that shown in FIG. 3 could be provided in a smaller area.

Figure 5:
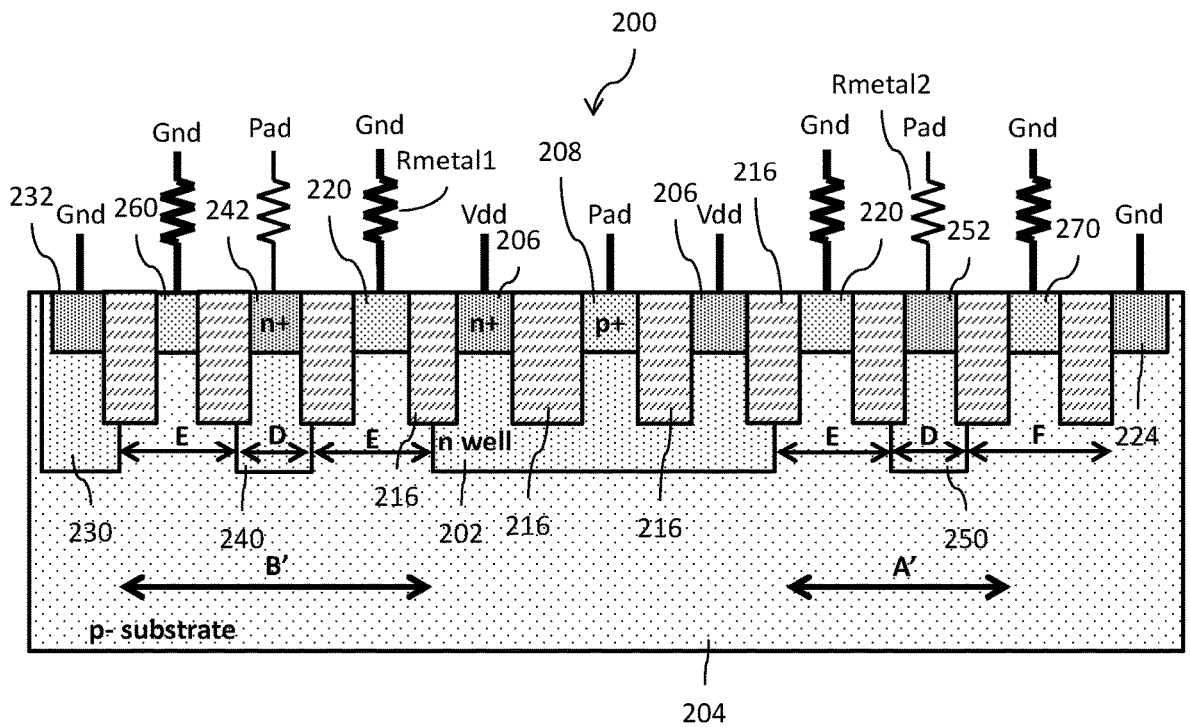
FIG. 5 is a cross-sectional view of an integrated circuit.

Reference is now made to FIG. 5 which shows a cross-section of an integrated circuit 200 which incorporates design techniques and structures for providing latch-up immunity. The integrated circuit 200 includes an n-type doped well 202 within a p-type doped substrate 204. The well 202 is referred to herein as a "hot n-well" which is defined in this instance as an n-type doped well that contains a heavily doped p-type region 208 forming a source/drain region of a pMOS transistor connected directly to an integrated circuit pad (Pad). A hot n-well may also be defined as the bulk of PMOS transistor with drain connected directly to an integrated circuit Pad or a base of PNP transistor with an emitter connected to an integrated circuit pad. The well 202 further includes a heavily doped n-type region 206 that is connected to a power supply node Vdd. The heavily doped n-type region 206 may, for example, form a guard ring structure that surrounds the heavily doped p-type region 208. The heavily doped p-type region 208 may be isolated from the heavily doped n-type region 206 by a shallow trench isolation (STI) structure 216.

The circuit 200 further includes a heavily doped p-type region 220 within the p-type doped substrate 204 to form a connection to the ground node (Gnd) through a resistance Rmetal1 formed by the inherent resistance of the metallization layers. The heavily doped p-type region 220 may, for example, form a guard ring structure that surrounds the well 202. The heavily doped p-type region 220 may be isolated from the heavily doped n-type region 206 by the STI structure 216.

A heavily doped n-type region 224 within the p-type doped substrate 204 is also connected to the ground node Gnd.

The circuit 200 further includes an n-type doped well 230 including a heavily doped n-type region 232 to form a connection to the ground node Gnd. The well 230 is referred to herein as a "grounded n-well."

The circuit 200 also includes a first n-type doped well 240 including a heavily doped n-type region 242 to form a connection to the integrated circuit pad (Pad) through a resistor Rmetal2. In an embodiment, the resistor Rmetal2 may have a resistance value of 20-50 Ohm (which can vary with design and technology constraints) where the resistance of Rmetal1 may, for example, be in the range of 1-20 Ohms. The well 240 is referred to herein as an "n-well strap." The well 240, with its heavily doped n-type region 242, is positioned between the well 202 and the well 230, and may be isolated from the heavily doped p-type region 220 by the STI structure 216. The well 240 has a lateral width D set by the design rules and is spaced from each of the well 202 and the well 230 by the design specific spacing E between adjacent n-wells as set by the design rules.

The circuit 200 also includes a second n-type doped well 250 including a heavily doped n-type region 252 to form a connection to the integrated circuit pad (Pad) through the resistor Rmetal2. The well 250 is referred to herein as an "n-well strap." The heavily doped n-type region 252 may be isolated from the heavily doped p-type region 220 and the heavily doped n-type region 224 by the STI structure 216, and is positioned between the well 202 and the heavily doped n-type region 224. The well 250 has a lateral width D set by the design rules and is spaced from the well 202 by the design specific spacing E between adjacent n-wells as set by the design rules and is furthermore spaced from the heavily doped n-type region 224 by the design specified spacing F between an n-well and a heavily doped n-type region in the p-type substrate as set by the design rules.

The circuit 200 further includes a heavily doped p-type region 260 within the p-type doped substrate 204 to form a connection to the ground node (Gnd) through a resistance Rmetal1 formed by the inherent resistance of the metallization layers. The heavily doped p-type region is positioned between the well 230 and 240 and may be isolated from both the heavily doped n-type region 232 and heavily doped n-type region 242 by the STI structure 216.

The circuit 200 further includes a heavily doped p-type region 270 within the p-type doped substrate 204 to form a connection to the ground node (Gnd) through a resistance Rmetal1 formed by the inherent resistance of the metallization layers. The heavily doped p-type region is positioned between the well 250 and heavily doped n-type region 224 and may be isolated from both the heavily doped n-type region 252 and heavily doped n-type region 224 by the STI structure 216.

The n-well straps providing an electrical connection through the resistor Rmetal2 to the integrated circuit pad (Pad) provides the necessary latch-up immunity by isolating the bipolar transistors from each other and hence preventing regenerative action. The advantage that the circuit 200 has over the circuit 100 is that the distance A' with which the heavily doped n-type region 224 is spaced from the well 202 is less than the distance A, where A'=E+D+F. Additionally, the distance B' with which the n-type doped well 230 is spaced from the well 202 is less than the distance B, where B'=2*E+D. Because of this, the circuit 200 will occupy a smaller area than the circuit 100 while still providing the necessary latch-up immunity. For example, the area of the circuit 200 is 37% smaller than the area of the circuit 100 for a first voltage from either Pad or Vdd to Gnd, and the area of the circuit 200 is 68% smaller than the area of the circuit 100 for a second voltage from either Pad or Vdd to Gnd, where the second voltage is greater than the first voltage. Additional advantages of the circuit 200 over the circuit 100 include the fact that there is no voltage dependence in the design structure (meaning that adjacent n-well spacing does need to be changed based on voltage magnitude) and the effectiveness of the latch-up immunity is no longer dependent on the efficiency of the double guard ring formed by the heavily doped n-type region 206 within the well 202 and the heavily doped p-type region 220 within the p-type doped substrate 204.

In an embodiment, the first n-type doped well 240 and the second n-type doped well 250 may be connected and form a well ring which surrounds the well 202 and is spaced apart therefrom by the minimum distance E. The heavily doped n-type regions 242 and 252 would then also be connected and form a guard ring. It will be understood, however, that the formation of a ring structure with wells 240 and 250 is not a requirement, and in some circuit implementations only the n-type doped well 240 with heavily doped n-type region 242 is needed as the latch concern exists primarily on the left-hand side of the circuit.

Figure 6:
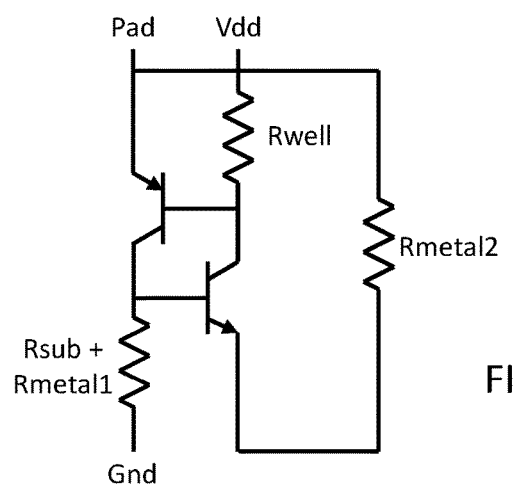
FIG. 6 is an equivalent circuit schematic of FIG. 5 showing parasitic bipolar transistors which form a thyristor immunized against latch-up.

The equivalent circuit schematic of the parasitic structures presented by the integrated circuit 200 is shown in FIG. 6.

Figure 7:
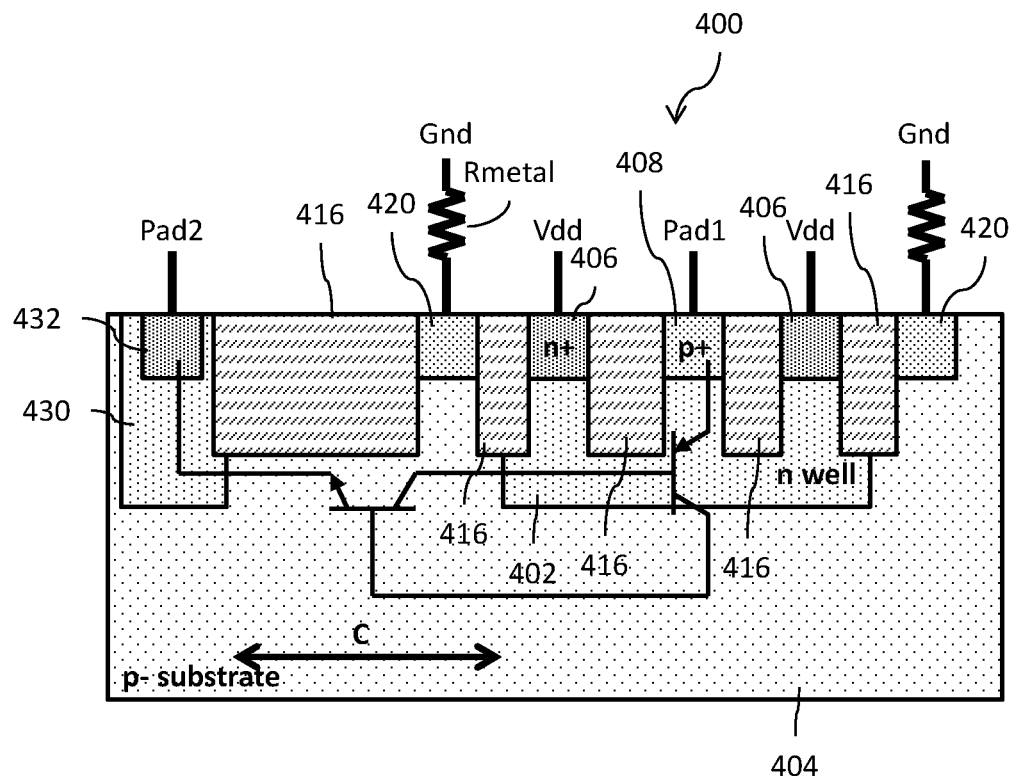
FIG. 7 is a cross-sectional view of an integrated circuit.

Reference is now made to FIG. 7 which shows a cross-section of an integrated circuit 400 which incorporates design techniques and structures for providing latch-up immunity. The integrated circuit 400 includes an n-type doped well 402 within a p-type doped substrate 404. The well 402 is referred to herein as a "hot n-well" which is defined in this instance as an n-type doped well that contains a heavily doped p-type region 408 forming a source/drain region of a pMOS transistor connected directly to a first integrated circuit pad (Pad1). A hot n-well may also be defined as the bulk of PMOS transistor with drain connected directly to an integrated circuit Pad or a base of PNP transistor with an emitter connected directly to the first integrated circuit pad (Pad1). The well 402 further includes a heavily doped n-type region 406 that is connected to a power supply node Vdd. The heavily doped n-type region 406 may, for example, form a guard ring structure that surrounds the heavily doped p-type region 408. The heavily doped p-type region 408 may be isolated from the heavily doped n-type region 406 by a shallow trench isolation (STI) structure 416.

The circuit 400 further includes a heavily doped p-type region 420 within the p-type doped substrate 404 to form a connection to the ground node (Gnd) through a resistance Rmetal formed by the inherent resistance of the metallization layers. The heavily doped p-type region 420 may, for example, form a guard ring structure that surrounds the well 402. The heavily doped p-type region 420 may be isolated from the heavily doped n-type region 406 by the STI structure 416.

The circuit 400 further includes an n-type doped well 430 including a heavily doped n-type region 432 to form a connection to a second integrated circuit pad (Pad2). The well 430 is referred to herein as an "emitter n-well." The well 430 and heavily doped n-type region 432 may be isolated from the heavily doped p-type region 420 by the STI structure 416.

To provide for latch-up immunity, the n-type doped well 430 is spaced from the well 402 by a distance C specified by the design rules for any n-well and a hot n-well in a p-type substrate. As an example, for a given voltage from either Pad or Vdd to Gnd that is greater than or equal to a threshold, the distance C is set to ensure a high impedance state of the PNPN thyristor and degrade the gain of the parasitic bipolar transistors.

Latch-up immunity is enhanced by enclosing the heavily doped p-type region 408 of the well 402 by a double guard ring formed by the heavily doped n-type region 406 within the well 402 and the heavily doped p-type region 420 within the p-type doped substrate 404.

Figure 8:
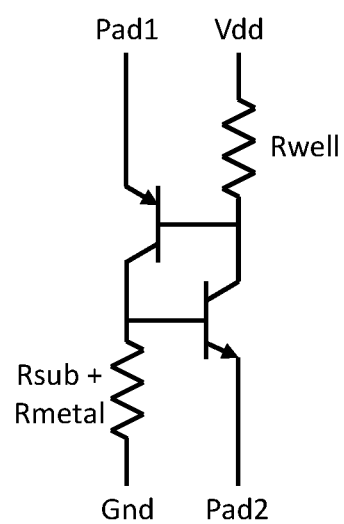
FIG. 8 is an equivalent circuit schematic of FIG. 7 showing parasitic bipolar transistors which form a thyristor immunized against latch-up.

The equivalent circuit schematic of the parasitic structures presented by the integrated circuit 400 is shown in FIG. 8.

The spacing requirement for distance C has an adverse effect on the occupied area of the integrated circuit 400. In order to provide the necessary latch-up immunity, the area occupied by these integrated circuits must be made larger in order to support the minimum spacing requirements and guard ring structure necessitated by the design rules. There would be an advantage if latch-up immunity for a circuit configuration like that shown in FIG. 7 could be provided in a smaller area.

Figure 9:
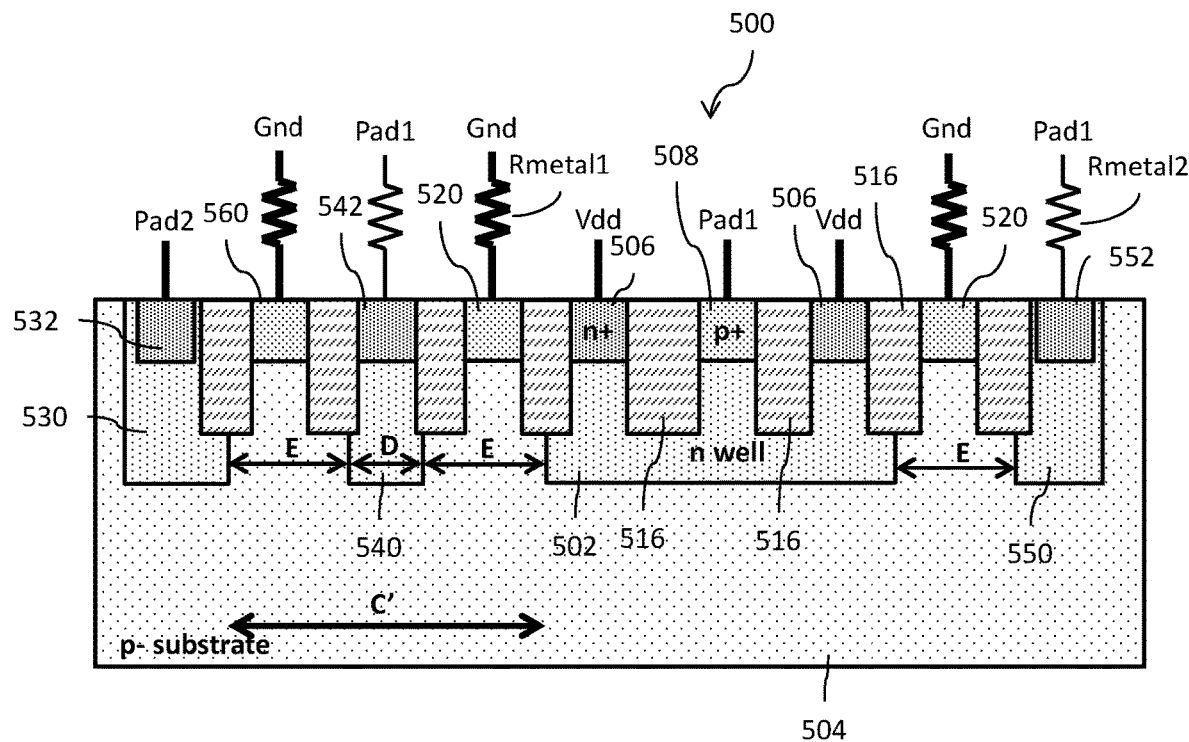
FIG. 9 is a cross-sectional view of an integrated circuit.

Reference is now made to FIG. 9 which shows a cross-section of an integrated circuit 500 which incorporates design techniques and structures for providing latch-up immunity. The integrated circuit 500 includes an n-type doped well 502 within a p-type doped substrate 504. The well 502 is referred to herein as a "hot n-well" which is defined in this instance as an n-type doped well that contains a heavily doped p-type region 508 forming a source/drain region of a pMOS transistor connected directly to a first integrated circuit pad (Pad1). A hot n-well may also be defined as the bulk of PMOS transistor with drain connected directly to an integrated circuit Pad or a base of PNP transistor with an emitter connected to the first integrated circuit pad (Pad1). The well 502 further includes a heavily doped n-type region 506 that is connected to a power supply node Vdd. The heavily doped n-type region 506 may, for example, form a guard ring structure that surrounds the heavily doped p-type region 508. The heavily doped p-type region 508 may be isolated from the heavily doped n-type region 506 by a shallow trench isolation (STI) structure 516.

The circuit 500 further includes a heavily doped p-type region 520 within the p-type doped substrate 504 to form a connection to the ground node (Gnd) through a resistance Rmetal1 formed by the inherent resistance of the metallization layers. The heavily doped p-type region 520 may, for example, form a guard ring structure that surrounds the well 502. The heavily doped p-type region 520 may be isolated from the heavily doped n-type region 506 by the STI structure 516.

The circuit 500 further includes an n-type doped well 530 including a heavily doped n-type region 532 to form a connection to a second integrated circuit pad (Pad2). The well 530 is referred to herein as an "emitter n-well."

The circuit 500 also includes a first n-type doped well 540 including a heavily doped n-type region 542 to form a connection to the first integrated circuit pad (Pad1) through a resistor Rmetal2. In an embodiment, the resistor Rmetal2 may have a resistance value of 20-50 Ohm (which can vary with design and technology constraints) where the resistance Rmetal1 may be in the range of 1-20 Ohms. The well 540 is referred to herein as an "n-well strap." The well 540, with its heavily doped n-type region 542, is positioned between the well 502 and the well 530, and may be isolated from heavily doped p-type region 520 by the STI structure 516. The well 540 has a lateral width D set by the design rules and is spaced from each of the well 502 and the well 530 by the design specific spacing E between adjacent n-wells as set by the design rules.

The circuit 500 also includes a second n-type doped well 550 including a heavily doped n-type region 552 to form a connection to the first integrated circuit pad (Pad1) through a resistor Rmetal2. The well 550 is referred to herein as an "n-well strap." The well 550, with its heavily doped n-type region 552, may be isolated from the heavily doped p-type region 520 by the STI structure 516. The well 550 is spaced from the well 502 by the design specific spacing E between adjacent n-wells as set by the design rules.

The circuit 500 further includes a heavily doped p-type region 560 within the p-type doped substrate 504 to form a connection to the ground node (Gnd) through a resistance Rmetal1 formed by the inherent resistance of the metallization layers. The heavily doped p-type region 560 is positioned between the n-well 530 and the n-well 540 and is isolated from each of the heavily doped n-type region 532 and the heavily doped n-type region 542 by the STI structure 516.

The n-well straps providing an electrical connection through the resistor Rmetal2 to the first integrated circuit pad (Pad1) provides the necessary latch-up immunity by isolating the bipolar transistors from each other and hence preventing regenerative action. The advantage that the circuit 500 has over the circuit 400 is that the distance C' with which the n-well 530 is spaced from the n-well 502 is less than the distance C, where C'=2*E+D. Because of this, the circuit 500 will occupy a smaller area than the circuit 400 while still providing the necessary latch-up immunity. For example, the area of the circuit 500 is 70% smaller than the area of the circuit 400 for a first voltage from either Pad1 or Vdd to Pad2, and the area of the circuit 500 is 81% smaller than the area of the circuit 400 for a second voltage from either Pad1 or Vdd to Pad2, where the second voltage is greater than the first voltage. Additional advantages of the circuit 500 over the circuit 400 include the fact that there is no voltage dependence in the design structure (meaning that adjacent n-well spacing does not change with voltage magnitude) and the effectiveness of the latch-up immunity is no longer dependent on the efficiency of the double guard ring formed by the heavily doped n-type region 506 within the well 502 and the heavily doped p-type region 520 within the p-type doped substrate 504.

In an embodiment, the first n-type doped well 540 and the second n-type doped well 550 may be connected and form a well ring which surrounds the well 502 and is spaced apart therefrom by the minimum distance E. The heavily doped n-type regions 542 and 552 would then also be connected and form a guard ring. It will be understood, however, that the formation of a ring structure with wells 540 and 550 is not a requirement.

Figure 10:
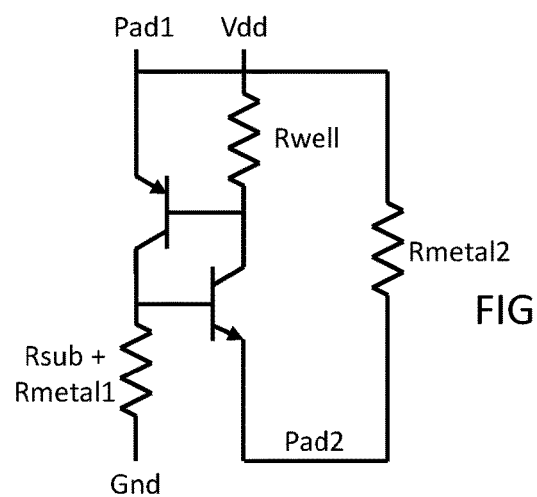
FIG. 10 is an equivalent circuit schematic of FIG. 9 showing parasitic bipolar transistors which form a thyristor immunized against latch-up.

The equivalent circuit schematic of the parasitic structures presented by the integrated circuit 500 is shown in FIG. 10.

Figure 11:
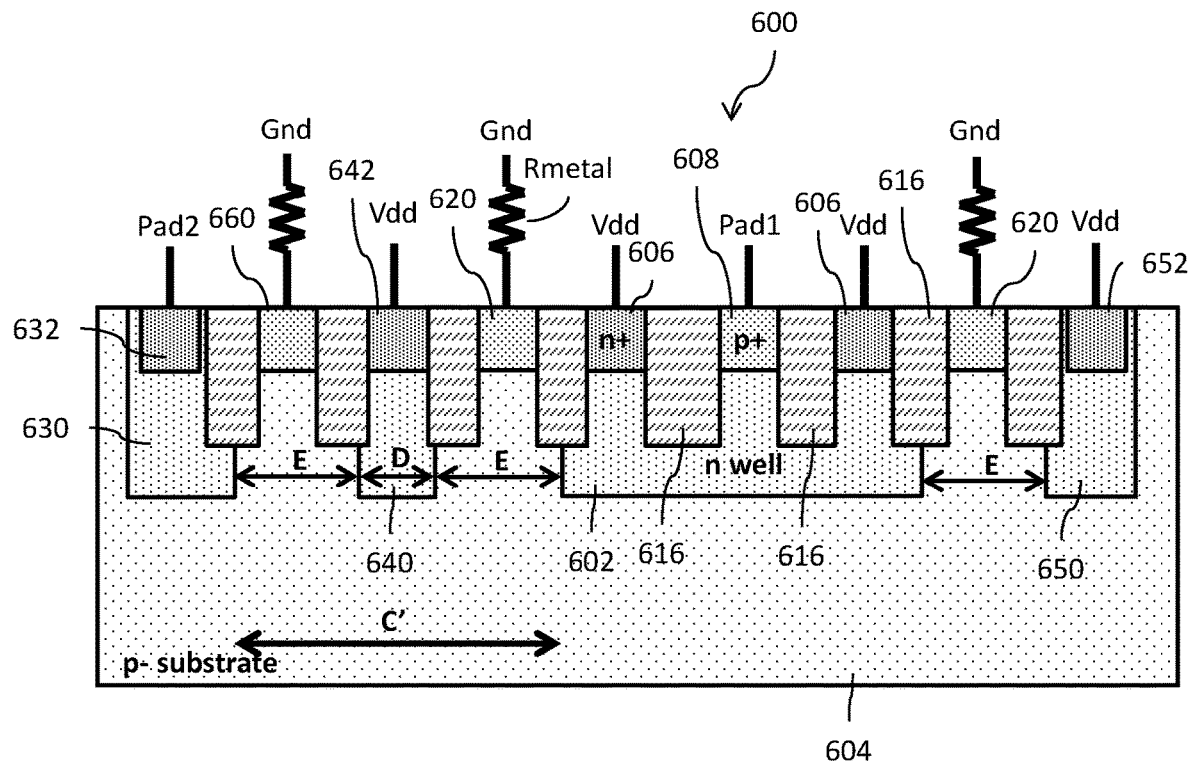
FIG. 11 is a cross-sectional view of an integrated circuit.

Reference is now made to FIG. 11 which shows a cross-section of an integrated circuit 600 which incorporates design techniques and structures for providing latch-up immunity. The integrated circuit 600 includes an n-type doped well 602 within a p-type doped substrate 604. The well 602 is referred to herein as a "hot n-well" which is defined in this instance as an n-type doped well that contains a heavily doped p-type region 608 forming a source/drain region of a pMOS transistor connected directly to a first integrated circuit pad (Pad1). A hot n-well may also be defined as the bulk of PMOS transistor with drain connected directly to an integrated circuit Pad or a base of PNP transistor with emitter connected to an integrated circuit pad. The well 602 further includes a heavily doped n-type region 606 that is connected to a power supply node Vdd. The heavily doped n-type region 606 may, for example, form a guard ring structure that surrounds the heavily doped p-type region 608. The heavily doped p-type region 608 may be isolated from the heavily doped n-type region 606 by a shallow trench isolation (STI) structure 616.

The circuit 600 further includes a heavily doped p-type region 620 within the p-type doped substrate 604 to form a connection to the ground node (Gnd) through a resistance Rmetal formed by the inherent resistance of the metallization layers. The heavily doped p-type region 620 may, for example, form a guard ring structure that surrounds the well 602. The heavily doped p-type region 620 may be isolated from the heavily doped n-type region 606 by the STI structure 616.

The circuit 600 further includes an n-type doped well 630 including a heavily doped n-type region 632 to form a connection to a second integrated circuit pad (Pad2). The well 630 is referred to herein as an "emitter n-well."

The circuit 600 also includes a first n-type doped well 640 including a heavily doped n-type region 642 to form a connection to the power supply node Vdd. The well 640 is referred to herein as an "n-well strap." The well 640, with its heavily doped n-type region 642, is positioned between the well 602 and the well 630. The heavily doped n-type region 642 may be isolated from the heavily doped p-type region 620 by the STI structure 616. The well 640 has a lateral width D set by the design rules and is spaced from each of the well 602 and the well 630 by the design specific spacing E between an n-well and a hot n-well as set by the design rules.

The circuit 600 also includes a second n-type doped well 650 including a heavily doped n-type region 652 to form a connection to the power supply node Vdd. The well 650 is referred to herein as an "n-well strap." The heavily doped n-type region 652 may be isolated from the heavily doped p-type region 620 by the STI structure 616. The well 650 is spaced from the well 602 by the design specific spacing E between an n-well and a hot n-well as set by the design rules.

The circuit 600 may further includes a heavily doped p-type region 660 within the p-type doped substrate 604 to form a connection to the ground node (Gnd) through a resistance Rmetal formed by the inherent resistance of the metallization layers. The heavily doped p-type region 660 is positioned between the n-well 630 and the n-well 640 and is isolated from each of the heavily doped n-type region 632 and the heavily doped n-type region 642 by the STI structure 616.

The n-well straps providing an electrical connection to the power supply node Vdd provides the necessary latch-up immunity by isolating the bipolar transistors from each other and hence preventing regenerative action. The advantage that the circuit 600 has over the circuit 400 is that the distance C' with which the n-well 630 is spaced from the n-well 602 is less than the distance C, where C'=2*E+D. Because of this, the circuit 600 will occupy a smaller area than the circuit 400 while still providing the necessary latch-up immunity. For example, the area of the circuit 600 is 55% smaller than the area of the circuit 400 for a first voltage from either Pad1 or Vdd to Pad2, and the area of the circuit 600 is 73% smaller than the area of the circuit 400 for a second voltage from either Pad1 or Vdd to Pad2, where the second voltage is greater than the first voltage. Additional advantages of the circuit 600 over the circuit 400 include the fact that there is no voltage dependence in the design structure (meaning that adjacent n-well spacing does not change with voltage magnitude) and the effectiveness of the latch-up immunity is no longer dependent on the efficiency of the double guard ring formed by the heavily doped n-type region 606 within the well 602 and the heavily doped p-type region 620 within the p-type doped substrate 604.

In an embodiment, the first n-type doped well 640 and the second n-type doped well 650 may be connected and form a well ring which surrounds the well 602 and is spaced apart therefrom by the design specific distance E. The heavily doped n-type regions 642 and 652 would then also be connected and form a guard ring. It will be understood, however, that the formation of a ring structure with wells 640 and 650 is not a requirement, and in some circuit implementations only the n-type doped well 640 with heavily doped n-type region 642 is needed as the latch concern exists primarily on the left-hand side of the circuit.

Figure 12:
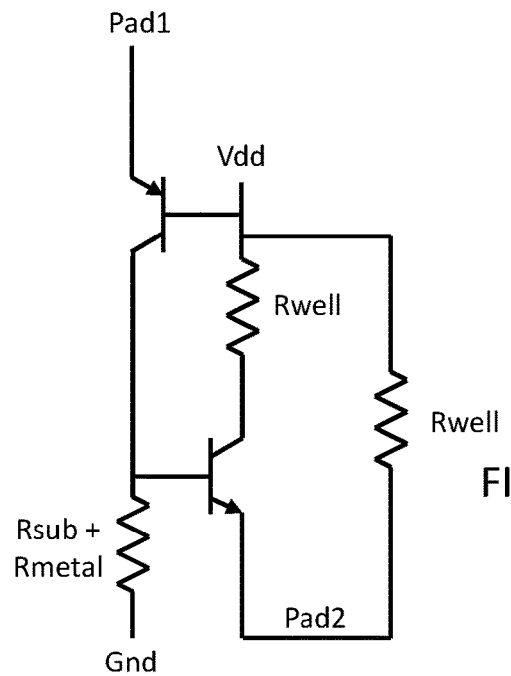
FIG. 12 is an equivalent circuit schematic of FIG. 11 showing parasitic bipolar transistors which form a thyristor immunized against latch-up.

The equivalent circuit schematic of the parasitic structures presented by the integrated circuit 600 is shown in FIG. 12.

Figure 13:
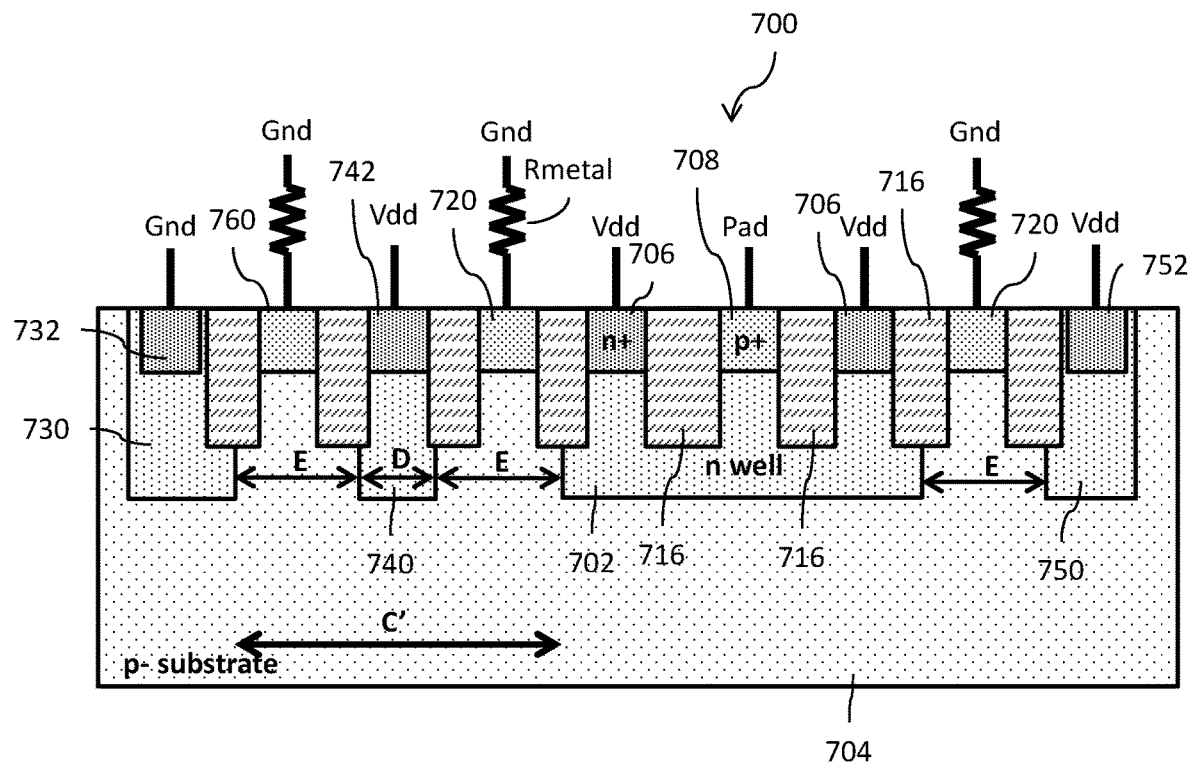
FIG. 13 is a cross-sectional view of an integrated circuit.

Reference is now made to FIG. 13 which shows a cross-section of an integrated circuit 700 which incorporates design techniques and structures for providing latch-up immunity. The integrated circuit 700 includes an n-type doped well 702 within a p-type doped substrate 704. The well 702 is referred to herein as a "hot n-well" which is defined in this instance as an n-type doped well that contains a heavily doped p-type region 708 forming a source/drain region of a pMOS transistor connected directly to an integrated circuit pad (Pad). A hot n-well may also be defined as the bulk of PMOS transistor with drain connected directly to an integrated circuit Pad or a base of PNP transistor with an emitter connected to the integrated circuit pad (Pad). The well 702 further includes a heavily doped n-type region 706 that is connected to a power supply node Vdd. The heavily doped n-type region 706 may, for example, form a guard ring structure that surrounds the heavily doped p-type region 708. The heavily doped p-type region 708 may be isolated from the heavily doped n-type region 706 by a shallow trench isolation (STI) structure 716.

The circuit 700 further includes a heavily doped p-type region 720 within the p-type doped substrate 704 to form a connection to the ground node (Gnd) through a resistance Rmetal formed by the inherent resistance of the metallization layers. The heavily doped p-type region 720 may, for example, form a guard ring structure that surrounds the well 702. The heavily doped p-type region 720 may be isolated from the heavily doped n-type region 706 by the STI structure 716.

The circuit 700 further includes an n-type doped well 730 including a heavily doped n-type region 732 to form a connection to the ground node (Gnd). The well 730 is referred to herein as a "grounded n-well."

The circuit 700 also includes a first n-type doped well 740 including a heavily doped n-type region 742 to form a connection to the power supply node Vdd. The well 740 is referred to herein as an "n-well strap." The well 740, with its heavily doped n-type region 742, is positioned between the well 702 and the well 730. The heavily doped n-type region 742 may be isolated from the heavily doped p-type region 720 by the STI structure 716. The well 740 has a lateral width D set by the design rules and is spaced from each of the well 702 and the well 730 by the design specific spacing E between an n-well and a hot n-well or grounded n-well as set by the design rules.

The circuit 700 also includes a second n-type doped well 750 including a heavily doped n-type region 752 to form a connection to the power supply node Vdd. The well 750 is referred to herein as an "n-well strap." The well 750, with its heavily doped n-type region 752, may be isolated from the heavily doped p-type region 720 by the STI structure 716. The well 750 is spaced from the well 702 by the design specific spacing E between an n-well and a hot n-well as set by the design rules.

The circuit 700 may further include a heavily doped p-type region 760 within the p-type doped substrate 704 to form a connection to the ground node (Gnd) through a resistance Rmetal formed by the inherent resistance of the metallization layers. The heavily doped p-type region 760 is positioned between the n-well 730 and the n-well 740 and is isolated from each of the heavily doped n-type region 732 and the heavily doped n-type region 742 by the STI structure 716.

The n-well straps providing an electrical connect on to the power supply node Vdd provides the necessary latch-up immunity by isolating the bipolar transistors from each other and hence preventing regenerative action. The advantage that the circuit 700 has over the circuit 100 is that the distance C' with which the n-well 730 is spaced from the n-well 702 is less than the distance C, where C'=2*E+D. Because of this, the circuit 700 will occupy a smaller area than the circuit 100 while still providing the necessary latch-up immunity. For example, the area of the circuit 700 is 25% smaller than the area of the circuit 100 for a first voltage from either Pad or Vdd to Gnd, and the area of the circuit 700 is 60% smaller than the area of the circuit 100 for a second voltage from either Pad or Vdd to Gnd, where the second voltage is greater than the first voltage. Additional advantages of the circuit 700 over the circuit 100 include the fact that there is no voltage dependence in the design structure (meaning the adjacent n-well spacing does not change with voltage magnitude) and the effectiveness of the latch-up immunity is no longer dependent on the efficiency of the double guard ring formed by the heavily doped n-type region 706 within the well 702 and the heavily doped p-type region 720 within the p-type doped substrate 704.

In an embodiment, the first n-type doped well 740 and the second n-type doped well 750 may be connected and form a well ring which surrounds the well 702 and is spaced apart therefrom by the design specific distance E. The heavily doped n-type regions 742 and 752 would then also be connected and form a guard ring. It will be understood, however, that the formation of a ring structure with wells 740 and 750 is not a requirement, and in some circuit implementations only the n-type doped well 740 with heavily doped n-type region 742 is needed as the latch concern exists primarily on the left-hand side of the circuit.

Figure 14:
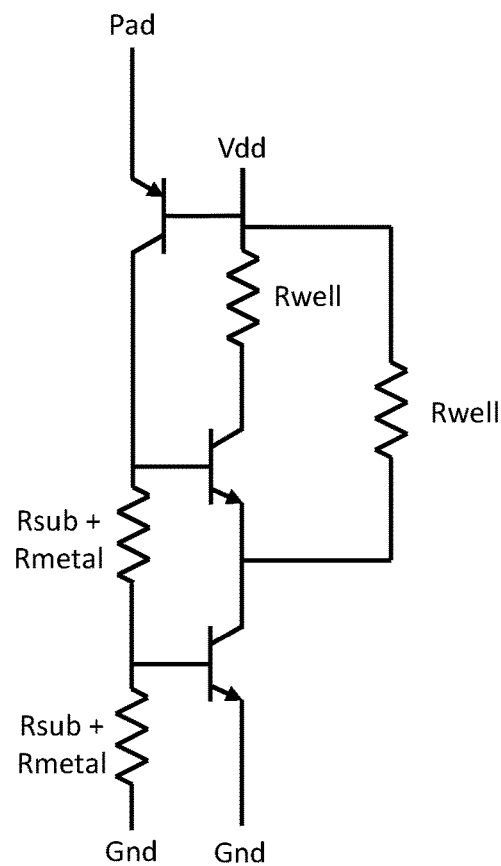
FIG. 14 is an equivalent circuit schematic of FIG. 13 showing parasitic bipolar transistors which form a thyristor immunized against latch-up.

The equivalent circuit schematic of the parasitic structures presented by the integrated circuit 700 is shown in FIG. 14.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit, comprising:
    a semiconductor substrate doped with a first conductivity type;
    a first semiconductor well doped with a second conductivity type within the semiconductor substrate and including:
        a first region heavily doped with the second conductivity type, wherein the first region is connected to a supply node; and
        a second region heavily doped with the first conductivity type, wherein the second region is connected to a first integrated circuit pad;
    a second semiconductor well doped with the second conductivity type within the semiconductor substrate;
    a third region heavily doped with the second conductivity type within the second semiconductor well, wherein the third region is connected to a second integrated circuit pad;
    a third semiconductor well doped with the second conductivity type within the semiconductor substrate; and
    a fourth region heavily doped with the second conductivity type within the third semiconductor well, wherein the fourth region is connected to the first integrated circuit pad through a resistor;
    wherein the third semiconductor well is positioned within the semiconductor substrate between the first semiconductor well and the second semiconductor well.

2. The integrated circuit of claim 1, wherein the third semiconductor well is laterally spaced from the first semiconductor well by a design specific distance between adjacent wells having a same conductivity type as specified by design rules for the integrated circuit.

3. The integrated circuit of claim 1, wherein the third semiconductor well is laterally spaced from the second semiconductor well by a design specific distance between adjacent wells having a same conductivity type as specified by design rules for the integrated circuit.

4. The integrated circuit of claim 1, wherein the third semiconductor well is laterally spaced from each of the first and second semiconductor wells by a design specific distance between adjacent wells having a same conductivity type as specified by design rules for the integrated circuit.

5. The integrated circuit of claim 1, wherein the third semiconductor well surrounds the first semiconductor well.

6. The integrated circuit of claim 1, wherein the third semiconductor well does not surround the first semiconductor well.

7. The integrated circuit of claim 1, further comprising a fifth region heavily doped with the first conductivity type within the semiconductor substrate, said fifth region positioned between the first semiconductor well and the third semiconductor well.

8. The integrated circuit of claim 7, wherein the fifth region surrounds the first semiconductor well.

9. The integrated circuit of claim 7, wherein the fifth region is connected to the ground node through a metallization having an inherent metallization resistance.

10. The integrated circuit of claim 7, wherein the fifth region is isolated from the first and fourth regions by a shallow trench isolation.

11. The integrated circuit of claim 1, further comprising a sixth region heavily doped with the first conductivity type within semiconductor substrate, said sixth region positioned between the second semiconductor well and the third semiconductor well.

12. The integrated circuit of claim 11, wherein the sixth region is connected to the ground node through a metallization having an inherent metallization resistance.

13. The integrated circuit of claim 11, wherein the sixth region is isolated from each of the third and fourth regions by a shallow trench isolation.

14. The integrated circuit of claim 1, wherein the first region surrounds the second region.

15. An integrated circuit, comprising:
    a semiconductor substrate doped with a first conductivity type;
    a first semiconductor well doped with a second conductivity type within the semiconductor substrate and including:
        a first region heavily doped with the second conductivity type, wherein the first region is connected to a supply node; and
        a second region heavily doped with the first conductivity type, wherein the second region is connected to a first integrated circuit pad;
    a second semiconductor well doped with the second conductivity type within the semiconductor substrate;
    a third region heavily doped with second conductivity type within the second semiconductor well, wherein the third region is connected to a second integrated circuit pad;
    a third semiconductor well doped with the second conductivity type within the semiconductor substrate; and
    a fourth region heavily doped with second conductivity type within the third semiconductor well, wherein the fourth region is connected to a power supply node;
    wherein the third semiconductor well is positioned within the semiconductor substrate between the first semiconductor well and the second semiconductor well.

16. The integrated circuit of claim 15, wherein the third semiconductor well is laterally spaced from the first semiconductor well by a design specific distance between adjacent wells having a same conductivity type as specified by design rules for the integrated circuit.

17. The integrated circuit of claim 15, wherein the third semiconductor well is laterally spaced from the second semiconductor well by a design specific distance between adjacent wells having a same conductivity type as specified by design rules for the integrated circuit.

18. The integrated circuit of claim 15, wherein the third semiconductor well is laterally spaced from each of the first and second semiconductor wells by a design specific distance between adjacent wells having a same conductivity type as specified by design rules for the integrated circuit.

19. The integrated circuit of claim 15, wherein the third semiconductor well surrounds the first semiconductor well.

20. The integrated circuit of claim 15, wherein the third semiconductor well does not surround the first semiconductor well.

21. The integrated circuit of claim 15, further comprising a fifth region heavily doped with the first conductivity type within the semiconductor substrate, said fifth region positioned between the first semiconductor well and the third semiconductor well.

22. The integrated circuit of claim 21, wherein the fifth region surrounds the first semiconductor well.

23. The integrated circuit of claim 21, wherein the fifth region is connected to the ground node through a metallization having an inherent metallization resistance.

24. The integrated circuit of claim 21, wherein the fifth region is isolated from the first and fourth regions by a shallow trench isolation.

25. The integrated circuit of claim 15, further comprising a sixth region heavily doped with the first conductivity type within semiconductor substrate, said sixth region positioned between the second semiconductor well and the third semiconductor well.

26. The integrated circuit of claim 25, wherein the sixth region is connected to the ground node through a metallization having an inherent metallization resistance.

27. The integrated circuit of claim 25, wherein the sixth region is isolated from each of the third and fourth regions by a shallow trench isolation.

28. The integrated circuit of claim 15, wherein the first region surrounds the second region.

29. An integrated circuit, comprising:
a semiconductor substrate doped with a first conductivity type;
a first semiconductor well doped with a second conductivity type within the semiconductor substrate and including:
a first region heavily doped with the second conductivity type, wherein the first region is connected to a supply node; and
a second region heavily doped with the first conductivity type, wherein the second region is connected to an integrated circuit pad;
a second semiconductor well doped with the second conductivity type within the semiconductor substrate;
a third region heavily doped with the second conductivity type within the second semiconductor well, wherein the third region is connected to a ground node;
a third semiconductor well doped with the second conductivity type within the semiconductor substrate; and
a fourth region heavily doped with the second conductivity type within the third semiconductor well, wherein the fourth region is connected to a power supply node;
wherein the third semiconductor well is positioned within the semiconductor substrate between the first semiconductor well and the second semiconductor well.

30. The integrated circuit of claim 29, wherein the third semiconductor well is laterally spaced from the first semiconductor well by a design specific distance between adjacent wells having a same conductivity type as specified by design rules for the integrated circuit.

31. The integrated circuit of claim 29, wherein the third semiconductor well is laterally spaced from the second semiconductor well by a design specific distance between adjacent wells having a same conductivity type as specified by design rules for the integrated circuit.

32. The integrated circuit of claim 29, wherein the third semiconductor well is laterally spaced from each of the first and second semiconductor wells by a design specific distance between adjacent wells having a same conductivity type as specified by design rules for the integrated circuit.

33. The integrated circuit of claim 29, wherein the third semiconductor well surrounds the first semiconductor well.

34. The integrated circuit of claim 29, wherein the third semiconductor well does not surround the first semiconductor well.

35. The integrated circuit of claim 29, further comprising a fifth region heavily doped with first conductivity type within the semiconductor substrate, said fifth region positioned between the first semiconductor well and the third semiconductor well.

36. The integrated circuit of claim 35, wherein the fifth region surrounds the first semiconductor well.

37. The integrated circuit of claim 35, wherein the fifth region is connected to the ground node through a metallization having an inherent metallization resistance.

38. The integrated circuit of claim 35, wherein the fifth region is isolated from the first and fourth regions by a shallow trench isolation.

39. The integrated circuit of claim 29, further comprising a sixth region heavily doped with first conductivity type within semiconductor substrate, said sixth region positioned between the second semiconductor well and the third semiconductor well.

40. The integrated circuit of claim 39, wherein the sixth region is connected to the ground node through a metallization having an inherent metallization resistance.

41. The integrated circuit of claim 39, wherein the sixth region is isolated from each of the third and fourth regions by a shallow trench isolation.

42. The integrated circuit of claim 29, wherein the first region surrounds the second region.

* * * * *